(12) United States Patent
Kimori et al.

(10) Patent No.: US 6,366,106 B1
(45) Date of Patent: Apr. 2, 2002

(54) PROBE NEEDLE FOR PROBE CARD

(75) Inventors: Yoshio Kimori; Yoshinobu Kageyama, both of Ono; Tomoki Kitafuji, Hyogo Pref., all of (JP)

(73) Assignee: Tokusen Kogyo Co., Ltd., Ono (JP)

( * ) Notice: Subject to any disclaimer, the term of this patent is extended or adjusted under 35 U.S.C. 154(b) by 0 days.

(21) Appl. No.: 09/642,654

(22) Filed: Aug. 22, 2000

(30) Foreign Application Priority Data

Aug. 31, 1999 (JP) .......................................... 11-245826

(51) Int. Cl.$^7$ .............................................. G01R 1/067
(52) U.S. Cl. ........................ 324/757; 324/754; 324/761
(58) Field of Search ................................ 324/757, 754, 324/761, 72.5; 112/222, 227

(56) References Cited

U.S. PATENT DOCUMENTS

| | | | |
|---|---|---|---|
| 5,378,971 A | * | 1/1995 | Yamashita .................. 324/72.5 |
| 5,532,613 A | * | 7/1996 | Nagasawa et al. ........... 324/761 |
| 5,713,910 A | * | 2/1998 | Gordon et al. ............... 606/144 |
| 6,300,783 B1 | * | 10/2001 | Okubo et al. ................ 324/754 |

FOREIGN PATENT DOCUMENTS

| | | |
|---|---|---|
| JP | 3-209738 | 9/1991 |
| JP | 5-41425 | 2/1993 |
| JP | 10-300779 | 11/1998 |
| JP | 11-38039 | 2/1999 |

* cited by examiner

*Primary Examiner*—Ernest Karlsen
(74) *Attorney, Agent, or Firm*—Browdy and Neimark

(57) ABSTRACT

A probe needle for a probe card which is characterized by applying a Ni plating containing PTFE to at least an end face of a tip portion thereof is disclosed. A Ni plating containing PTFE layer may preferably be formed on the tip portion of the probe needle by using a Ni plating layer as a substrate. The Ni plating may preferably have a thickness of 0.5–2 μm to ensure the adhesion of the Ni plating containing PTFE, while the Ni plating containing PTFE may preferably have a thickness of 0.5–2 μm to ensure the sliding property of the PTFE. In this probe needle, since the tip portion thereof is covered with the Ni plating containing PTFE layer, the wear resistance is not deteriorated, the favorable conductivity is obtained, and the oxidization of the end face which is brought into contact with an integrated circuit is prevented. Further, with the use of PTFE, the sliding property is enhanced so that the adhesion of the aluminum oxide can be substantially completely prevented thus ensuring the stable conductivity.

4 Claims, 2 Drawing Sheets

PROBE NEEDLE FOR PROBE CARD

BACKGROUND OF THE INVENTION

1. Field of the Invention

The present invention relates to a probe needle for a probe card which is employed for carrying out a current energization or conduction inspection of an integrated circuit chip on a semiconductor wafer.

2. Description of the Prior Art

A probe needle for a probe card which is employed in a current energization inspection (wafer test) of an integrated circuit chip in a semiconductor wafer manufacturing process has been made of tungsten, rhenium tungsten, beryllium copper or the like which is hard and resilient in material property. Particularly, tungsten which exhibits the excellent wear resistance and the excellent toughness is popularly used. However, although tungsten is a material which is excellent in wear resistance, elasticity, hardness and the like and has toughness and hence is a material suitable for a probe needle which is constituted by a thin wire member of several tens micron, tungsten is liable to be easily oxidized. Further, due to the frictional heat which is generated by the frictional wear or the generation of heat caused by the contact resistance when the tungsten which works as the probe needle is brought into contact with an electrode of an integrated circuit and is energized, the temperature at a tip portion of the probe is elevated and hence, the oxidization of tungsten is accelerated. Further, the probe is reacted with aluminum deposited to the integrated circuit and aluminum oxide is formed on and adhered to the tip portion of the needle after contacting of several thousand times to several ten thousand times.

In this manner, when the oxidization of the tip portion of the probe needle is accelerated and the aluminum oxide is adhered to the tip portion, the contact resistance of the surface of the tip portion of the needle is increased so that the conductivity is reduced. This gives rise to an adverse effect in the wafer test and maintenance such as polishing of the tip portion becomes necessary. Conventionally, although it depends on a condition in which the probe is used, the maintenance must be carried out after contacting of every several thousand times to several ten thousand times so that it gives rise to a problem with respect to the wafer test which is to be carried out fully automatically.

To solve such a problem, for example, as disclosed in Japanese laid-open patent publication 38039/1999, a method which adheres non-oxidizing metal such as gold, platinum or palladium to a tip portion of a probe needle is proposed as a method for improving the oxidization resistance. Further, in view of the deficiency of the wear resistance of non-oxidizing metal compared to the tungsten and the difficulty in adhering the non-oxidizing metal to the tip portion of the probe needle, there has been proposed another method. In this method, a non-oxidizing metal film is formed on a tip portion of the probe needle by metallizing such as electroplating and thereafter the tip portion of the probe needle is heated in a non-oxidizing atmosphere or in a vacuum and the non-oxidizing metal film is diffused into tungsten which forms a base material so as to reform the probe needle to a probe needle which has the excellent oxidization resistance and the conductivity while maintaining the wear resistance and the toughness of the tungsten body.

As described above, to improve the oxidization resistance of the probe needle, there has been proposed the method which adheres the non-oxidizing metal such as gold, platinum or palladium to the tip portion of the probe needle and also there has been proposed the property reforming method which reforms the property of the probe needle by diffusing the non-oxidizing metal film formed on the tip portion of the probe needle by metallizing into tungsten. However, these methods are not practical in terms of cost and operation. Further, it is difficult for these methods to prevent the adhesion of the aluminum oxide.

OBJECTS AND SUMMARY OF THE INVENTION

Accordingly, it is an object of the present invention to provide a probe needle for a probe card which can prevent the reduction of conductivity by preventing the oxidization of a surface of a tip portion of a probe needle and simultaneously preventing the adhesion of aluminum oxide to the tip portion of the probe needle.

The present invention overcomes the above-mentioned problems by applying a Ni(nickel) plating containing PTFE (polytetrafluoroethylene), that is, a Ni plating containing PTFE to a tip portion of a probe needle for a probe card. When an end face of the tip portion of the probe needle is covered with the Ni plating containing PTFE, the favorable conductivity is obtained and the oxidization of the end face which is brought into contact with an integrated circuit is prevented. Further, the sliding property is enhanced with the use of PTFE and hence, the adhesion of aluminum oxide can be substantially completely prevented thus ensuring the stable conductivity. As a result, compared to a conventional product which requires maintenance such as polishing every several thousand contacts or every several ten thousand contacts, the number of maintenance and time for such maintenance can be greatly reduced or it may be possible to make the maintenance no more necessary. Further, since the number of maintenance and time for such maintenance can be reduced, the inventory of spares can be minimized or made unnecessary whereby the inspection cost and accordingly the manufacturing cost can be greatly reduced.

When the base material of the probe needle is tungsten, a Ni plating is preferably applied as a substrate so that the adhesion of the Ni plating containing PTFE which forms a main plating can be enhanced. In this case, the Ni plating may preferably be formed by an electroplating so that the main plating and the base material are completely hermetically adhered to each other. Further, the thickness of respective plating is preferably set such that the Ni plating has a thickness of 0.5–2 $\mu$m and the Ni plating containing PTFE has a thickness of 0.5–2 $\mu$m. The Ni plating which forms the substrate is required to have at least the thickness of not less than 0.5 $\mu$m which is a thickness of strike bath to ensure the adhesion of the Ni plating containing PTFE, while the thickness exceeding 2 $\mu$m is wasteful in terms of cost and time. Further, the Ni plating containing PTFE is also required to have the thickness of not less than 0.5 $\mu$m to ensure the sliding property, while the thickness exceeding 2 $\mu$m is wasteful in terms of cost and time as in the case of the Ni plating.

The probe needle of the present invention does not deteriorate the wear resistance of the base material, has the favorable conductivity, and can prevent the oxidation of the end face which is brought into contact with the integrated circuit. Further, the adhesion of the aluminum oxide can be substantially completely prevented thus ensuring the stable conductivity. Accordingly, compared to a conventional product which requires maintenance such as polishing every several thousand contacts or every several ten thousand contacts, the number of maintenance and time for such maintenance can be greatly reduced or it may be possible to make the maintenance no more necessary so that the inventory of spares which are used at the time of maintenance can be minimized or made unnecessary thus greatly reducing the inspection cost and accordingly the manufacturing cost.

Further, according to the present invention, compared to a conventional method in which the non-oxidizing metal is adhered or another conventional method in which the non-oxidizing metal film is diffused into the base material so as to reform the base material, the probe needle can be manufactured in a more inexpensive manner and the probe needle having the stable quality can be obtained.

The above and other objects, features and advantages of the present invention will become apparent from the following detailed description which is to be read in conjunction with the accompanying drawings.

DETAILED DESCRIPTION OF THE PREFERRED EMBODIMENTS

Figure 1:
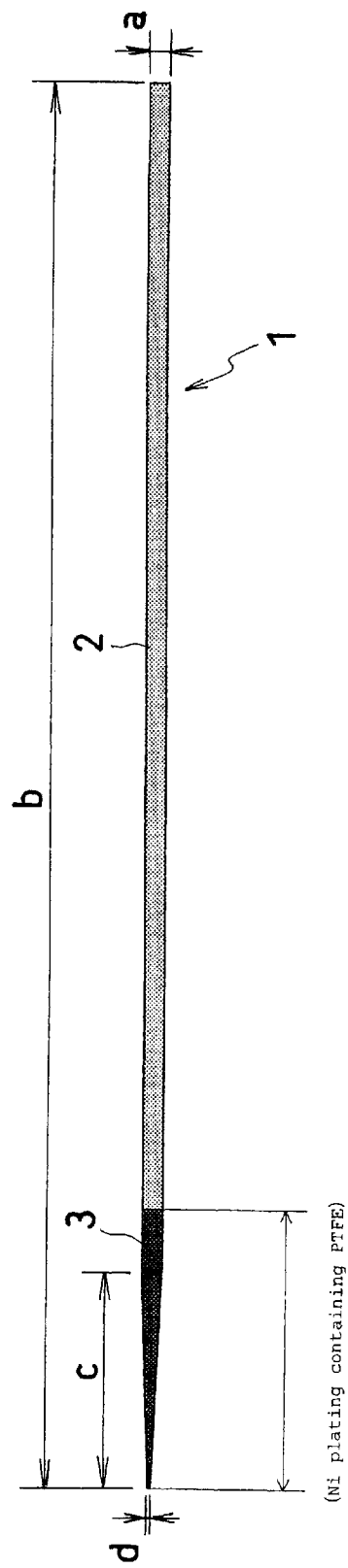
FIG. 1 is a plan view showing an intermediate specification of a probe needle according to one embodiment of the present invention.

One embodiment of the present invention is explained hereinafter in conjunction with FIG. 1 and FIG. 2.

In the drawings, numeral 1 indicates a probe needle. Several tens to several hundreds probe needles 1 are provided to a printed wiring board (not shown in the drawings) of a probe card for carrying out a current energization inspection of an integrated circuit chip mounted on a semiconductor wafer. A base material of the probe needle 1 is made of tungsten, for example, and has a wire diameter "a" of 0.1–0.7 mm and an entire length "b" of 25–90 mm. A tip side of the probe needle 1 is sharpened in a straight tapered shape within a given length "c" (for example, 0.3–6 mm) and a diameter "d" of an end face of the probe needle 1 is set to, for example, not larger than 0.02 mm.

The probe needle 1 which is processed in this manner is held under a straight condition shown in FIG. 1. First of all, a Ni plating is applied to the probe needle 1 by an electroplating and then a Ni plating containing PTFE is applied to a tip portion of the probe needle 1 preferably by an electroplating while using the Ni plating layer as a substrate. The Ni plating containing PTFE is performed by using a plating method which is known per se.

In the drawings, numeral 2 indicates a Ni plating layer and numeral 3 indicates a Ni plating containing PTFE layer. In the illustrated embodiment, the whole surface of the base material is covered with the Ni plating layer 2 and a Ni plating containing PTFE is applied to a portion of the probe needle 1 ranging from the sharpened head portion to a portion of a needle middle portion so as to form the Ni plating containing PTFE layer 3. The range of the Ni plating containing PTFE layer 3 is not limited to the range disclosed in the above-mentioned illustrated embodiment. The range can be suitably changed within a scope which includes at least an end face of the tip portion of the needle and excludes a portion of the middle portion of the needle which is soldered to a printed wiring. Further, in the illustrated embodiment, the Ni plating is applied to the whole surface of the probe needle 1 for the purpose of enhancing the soldering of the Ni plating of the middle portion of the needle while employing the Ni plating as the substrate for the Ni plating containing PTFE. However, it is unnecessary to simultaneously apply the Ni plating to the whole surface of the needle 1 and the Ni plating may be separately applied to a substrate portion for the Ni plating containing TPFE and a portion for soldering.

The Ni plating which works as a substrate may preferably have a thickness of 0.5–2 µm to ensure the adhesion of the Ni plating containing PTFE. The thickness exceeding 2 µm is wasteful in terms of cost and time. Further, the Ni plating containing PTFE may preferably have a thickness of 0.5–2 µm to ensure the sliding property brought about by PTFE. In this case, the thickness exceeding 2 µm is also wasteful in terms of cost and time.

Figure 2:
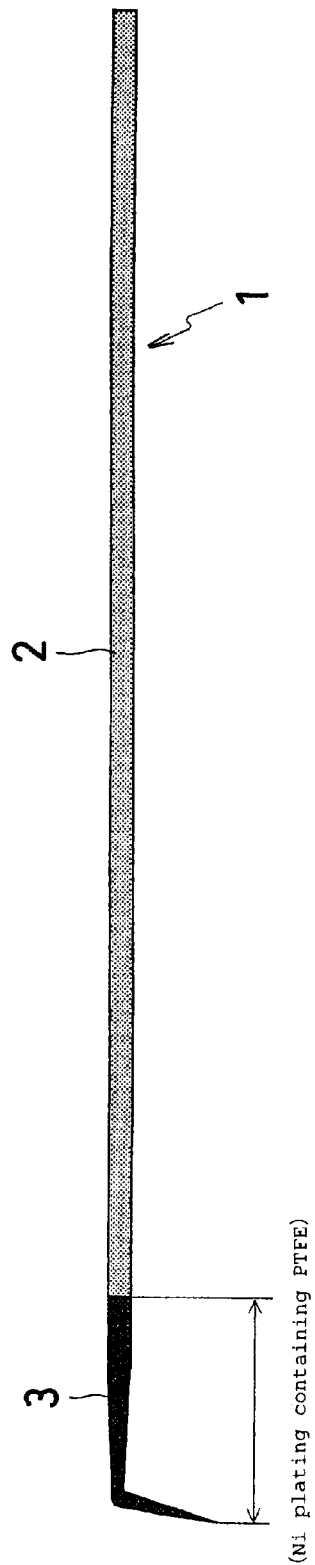
FIG. 2 is a plan view showing a final specification of the probe needle shown in FIG. 1.

After applying the Ni plating containing PTFE, the tip of the sharpened head portion of the probe needle 1 is bent in a hook shape and is served for operations as shown in FIG. 2.

Since the probe needle 1 has the tip portion thereof covered with the Ni plating containing PTFE layer 3, the wear resistance is not deteriorated, the favorable conductivity is obtained and the oxidization of the end face which is brought into contact with the integrated circuit is prevented. With the use of the PTFE, the sliding property is enhanced so that the adhesion of the aluminum oxide can be substantially completely prevented thus ensuring the stable conductivity.

A current energization inspection was actually carried out by using a probe card which employs this probe needle 1. From the result of the inspection, it was confirmed that the conductivity was not reduced even after contacting of 300,000 to 500,000 times.

It will be appreciated that modifications may be made in our invention. For example, the present invention is applicable to a probe needle which uses rhenium tungsten, beryllium copper or the like as a base material in place of tungsten, or a Cu plating or the like may be applied as a substrate in place of the Ni plating. Further, although the Ni plating containing PTFE may suitably be applied by using the electroplating, other method such as a nonelectrolytic plating or the like can be used.

Further, the present invention is similarly applicable to a probe needle whose tip is not provided with the sharpening processing.

Accordingly, it should be understood that we intend to cover by the appended claims all modifications falling within the true spirit and scope of our invention.

What is claimed is:

1. A probe needle for a probe card including a Ni plating containing PTFE which is applied to at least an end face of a tip portion of the probe needle.

2. A probe needle for a probe card according to claim 1, wherein a Ni plating is applied to a substrate for the Ni plating containing PTFE.

3. A probe needle for a probe card according to claim 2, wherein the Ni plating is formed by an electroplating.

4. A probe needle for a probe card according to claim 2, wherein the Ni plating has a thickness of 0.5–2 µm and the Ni plating containing PTFE has a thickness of 0.5–2 µm.

* * * * *

UNITED STATES PATENT AND TRADEMARK OFFICE
CERTIFICATE OF CORRECTION

PATENT NO. : 6,366,106 B1
DATED : April 2, 2002
INVENTOR(S) : Kimori et al.

It is certified that error appears in the above-identified patent and that said Letters Patent is hereby corrected as shown below:

<u>Title page,</u>
Item [*] Notice, delete "by 0 days" and insert -- by 36 days --

Signed and Sealed this

Eleventh Day of May, 2004

JON W. DUDAS
*Acting Director of the United States Patent and Trademark Office*